(12) United States Patent
Shen

(10) Patent No.: US 7,053,473 B2
(45) Date of Patent: May 30, 2006

(54) COMPACT INTEGRATED CIRCUIT PACKAGE

(76) Inventor: Yu-Nung Shen, 4F, No. 52, Sec. 2, Ching-Shan N. Rd., Taipei City (TW)

(*) Notice: Subject to any disclaimer, the term of this patent is extended or adjusted under 35 U.S.C. 154(b) by 10 days.

(21) Appl. No.: 10/764,904

(22) Filed: Jan. 26, 2004

(65) Prior Publication Data
US 2004/0155359 A1   Aug. 12, 2004

(30) Foreign Application Priority Data
Jan. 30, 2003   (TW) ............................... 92102324 A

(51) Int. Cl.
*H01L 23/06* (2006.01)
(52) U.S. Cl. ............... 257/684; 257/738; 257/678; 257/737; 438/106; 438/121; 438/613
(58) Field of Classification Search ................ 257/678, 257/684, 685, 686, 687, 690, 698, 700, 734, 257/737, 738, 777, 780, 787, 790, 792, 793, 257/794; 438/106, 121, 613
See application file for complete search history.

(56) References Cited

U.S. PATENT DOCUMENTS 6,841,413 B1 * 1/2005 Liu et al. .................... 438/106
2004/0041271 A1 * 3/2004 Storli ......................... 257/759

* cited by examiner

*Primary Examiner*—Nathan J. Flynn
*Assistant Examiner*—Scott R. Wilson
(74) *Attorney, Agent, or Firm*—Ladas & Parry LLP

(57) ABSTRACT

A method for making a semiconductor device includes mounting a die on a die-mounting substrate, providing an interposer on the substrate, forming a conductive strip that is laid on the interposer and that is electrically connected to a bonding pad of the die and to a contact of the substrate, forming an encapsulant layer on the interposer, and forming a solder bump that is electrically connected to the conductive strip and protrudes outwardly from the encapsulant layer.

48 Claims, 20 Drawing Sheets

COMPACT INTEGRATED CIRCUIT PACKAGE

CROSS-REFERENCE TO RELATED APPLICATION

This application claims priority of Taiwanese Application No. 092102324, filed on Jan. 30, 2003.

BACKGROUND OF THE INVENTION

1. Field of the Invention

This invention relates to a semiconductor device, and more particularly to a BGA-based (Ball Grid Array-based) semiconductor device and to a method for making the same.

2. Description of the Related Art

Conventional lead-based semiconductor devices normally include a semiconductor die with bonding pads that are connected electrically and respectively to leads of a lead frame through bonding wires so as to connect internal circuits of the semiconductor die to external circuits through the leads. The conventional semiconductor devices thus formed have relatively large dimensions. Conventional ball grid array (BGA)-based semiconductor devices have smaller dimensions as compared to those of the lead-based semiconductor devices. Assembly of different semiconductor dies in a single package is the current trend in the semiconductor industry for miniaturization of electronic devices. However, the conventional method for manufacturing a semiconductor die is normally inappropriate for a different one, which increases the difficulty for assembling different semiconductor dies in a single package and which may result in an increase in manufacturing costs.

SUMMARY OF THE INVENTION

The object of the present invention is to provide a semiconductor device that is capable of overcoming the aforesaid drawback of the prior art.

Another object of the present invention is to provide a method for making the semiconductor device.

According to one aspect of the present invention, there is provided a semiconductor device that comprises: a die-mounting substrate having a die-mounting surface and formed with a plurality of conductive contacts on the die-mounting surface; at least one semiconductor die attached to the die-mounting surface, having a pad-mounting surface opposite to the die-mounting surface, and formed with a plurality of spaced apart bonding pads on the pad-mounting surface; a dielectric interposer formed on the die-mounting surface and formed with at least one pad-through-hole and a plurality of contact-through-holes, the pad-through-hole receiving the die therein and exposing the pad-mounting surface therefrom, each of the contact-through-holes receiving a respective one of the contacts therein and exposing the respective one of the contacts therefrom; a plurality of conductive strips formed on the pad-mounting surface and the interposer, each of the conductive strips having a pad-connecting part that is electrically connected to and that extends from a respective one of the bonding pads, and a trace part that extends from the pad-connecting part to connect electrically with a respective one of the conductive contacts; an encapsulant layer formed on the die-mounting surface, the interposer, the conductive strips, and the pad-mounting surface of the die, and formed with a plurality of bump-through-holes, each of which exposes a portion of the trace part of a respective one of the conductive strips therefrom; and a plurality of solder bumps, each of which fills a respective one of the bump-through-holes to connect electrically with the portion of the trace part of a respective one of the conductive strips and each of which protrudes outwardly from the encapsulant layer.

According to another aspect of the present invention, there is provided a method for making the semiconductor device. The method comprises the steps of: preparing a die-mounting substrate that has a die-mounting surface and that is formed with a plurality of conductive contacts on the die-mounting surface; preparing a semiconductor die that has a pad-mounting surface, and a plurality of spaced apart bonding pads formed on the pad-mounting surface; attaching the semiconductor die to the die-mounting surface; preparing a dielectric interposer that is formed with a pad-through-hole and a plurality of contact-through-holes; attaching the interposer to the die-mounting surface in such a manner that the die is received in and is exposed from the pad-through-hole and that each of the contacts is received in and is exposed from a respective one of the contact-through-holes; forming a plurality of conductive strips on the pad-mounting surface and the interposer, each of the conductive strips having a pad-connecting part that is electrically connected to and that extends from a respective one of the bonding pads, and a trace part that extends from the pad-connecting part to connect electrically with a respective one of the conductive contacts; forming an encapsulant layer on the die-mounting surface, the interposer, and the conductive strips; forming a plurality of bump-through-holes in the encapsulant layer in such a manner that each of the bump-through-holes exposes a portion of the trace part of a respective one of the conductive strips; and forming a plurality of solder bumps, each of which fills a respective one of the bump-through-holes to connect electrically with the portion of the trace part of a respective one of the conductive strips, and each of which protrudes outwardly from the protective layer.

BRIEF DESCRIPTION OF THE DRAWINGS

In drawings which illustrate embodiments of the invention.

DETAILED DESCRIPTION OF THE PREFERRED EMBODIMENTS

Figure 1:
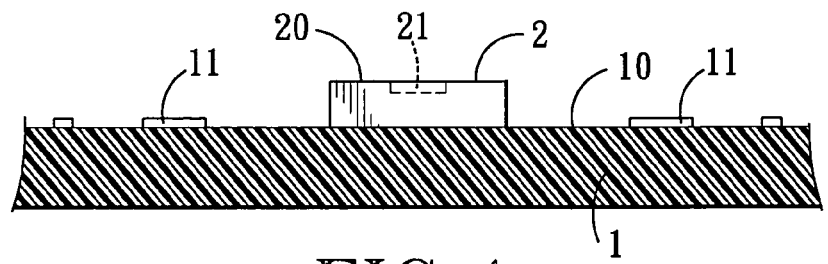
FIG. 1 is a schematic view to illustrate how a semiconductor die is attached to a die-mounting substrate for forming a semiconductor device according to the first preferred embodiment of a method of this invention.
Figure 2:
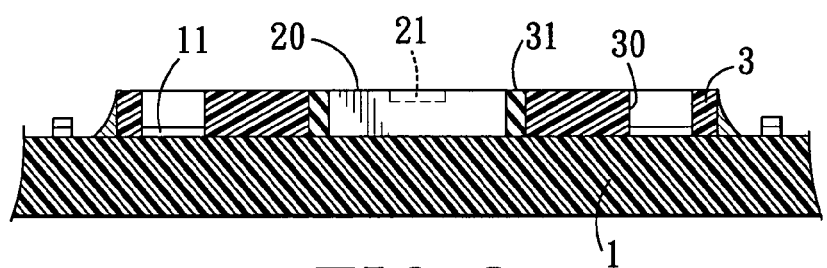
FIG. 2 is a schematic view to illustrate how a dielectric interposer is provided on the die-mounting substrate according to the first preferred embodiment of this invention.
Figure 3:
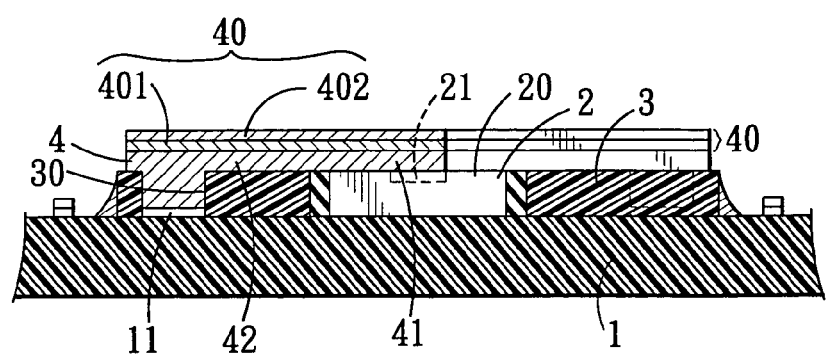
FIG. 3 is a schematic view to illustrate how a conductive strip is formed on the die and the interposer according to the first preferred embodiment of this invention.
Figure 4:
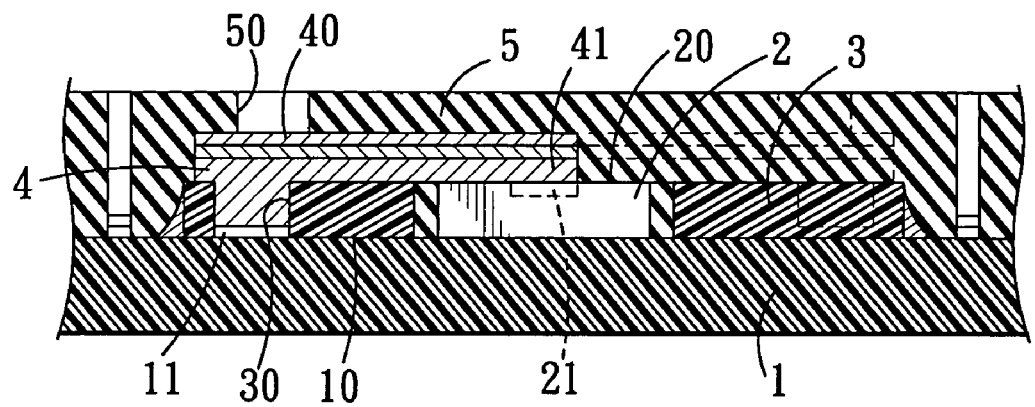
FIG. 4 is a schematic view to illustrate how an encapsulant layer is formed on the assembly of FIG. 3 according to the first preferred embodiment of this invention.
Figure 5:
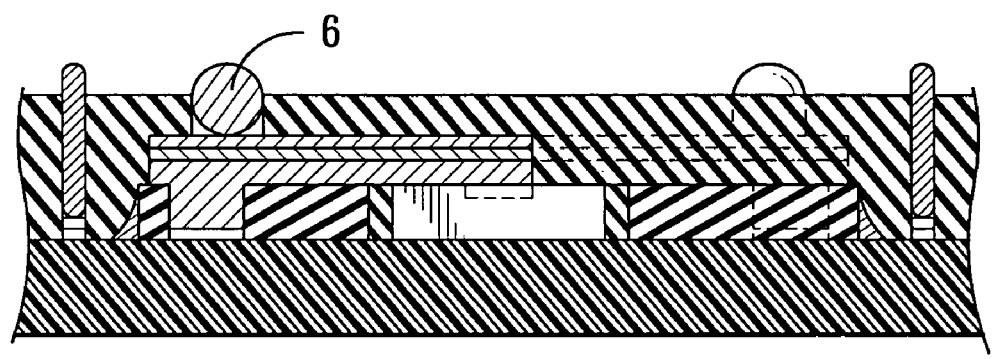
FIG. 5 is a schematic view to illustrate how a solder bump is formed on the encapsulant layer and is electrically connected to the conductive strip according to the first preferred embodiment of this invention.

For the sake of brevity, like elements are denoted by the same reference numerals throughout the disclosure.

FIGS. 1 to 5 illustrate consecutive steps of forming a semiconductor device according to the first preferred embodiment of the method of this invention.

The method of this embodiment includes the steps of: preparing a die-mounting substrate 1 that has a die-mounting surface 10 and that is formed with a plurality of conductive contacts 11 on the die-mounting surface 10 (see FIG. 1) and a plurality of traces connected to the contacts 11, respectively; preparing a semiconductor die 2 that has a pad-mounting surface 20, and a plurality of spaced apart bonding pads 21 formed on the pad-mounting surface 20 (only one is shown), each of the bonding pads 21 being preferably formed with a metal plating layer (not shown); attaching the semiconductor die 2 to the die-mounting surface 10 (see FIG. 1); preparing a dielectric interposer 3, such as a resinous packaging substrate, that is formed with a pad-through-hole 31 and a plurality of contact-through-holes 30 (see FIG. 2); attaching the interposer 3 to the die-mounting surface 10 in such a manner that the die 2 is received in the pad-through-hole 31 and has the pad-mounting surface 20 thereof exposed from the pad-through-hole 31 and that each of the contacts 11 is registered with and is exposed from a respective one of the contact-through-holes 30 (see FIG. 2); forming a plurality of conductive strips 4 on the pad-mounting surface 20 and the interposer 3 (see FIG. 3), each of the conductive strips 4 having a pad-connecting part 41 that is electrically connected to and that extends from a respective one of the bonding pads 21, and a trace part 42 that extends from the pad-connecting part 41 to connect electrically with a respective one of the conductive contacts 11, each of the conductive strips 4 being made from a conductive paste; forming an encapsulant layer 5 on the die-mounting surface 10, the pad-mounting surface 20, the interposer 3, and the conductive strips 4 (see FIG. 4); forming a plurality of bump-through-holes 50 in the encapsulant layer 5 in such a manner that each of the bump-through-holes 50 exposes a portion of the trace part 42 of a respective one of the conductive strips 4; and forming a plurality of solder bumps 6, each of which fills a respective one of the bump-through-holes 50 to connect electrically with the exposed portion of the trace part 42 of a respective one of the conductive strips, and each of which protrudes outwardly from the encapsulant layer 5. Note that the trace part 42 of each conductive body 4 preferably has a metal layer 40 (see FIG. 3), which is electrically connected to the respective solder bump 6 and which includes a nickel sub-layer 401 and a gold sub-layer 402 so as to increase the conductivity of the conductive strips 4. The die-mounting substrate 1 is preferably a printed circuit board, or is made from a material selected from a group consisting of polyimide, glass, and ceramic. The encapsulant layer 5 is preferably made from polyimide or photo ink.

Figure 6:
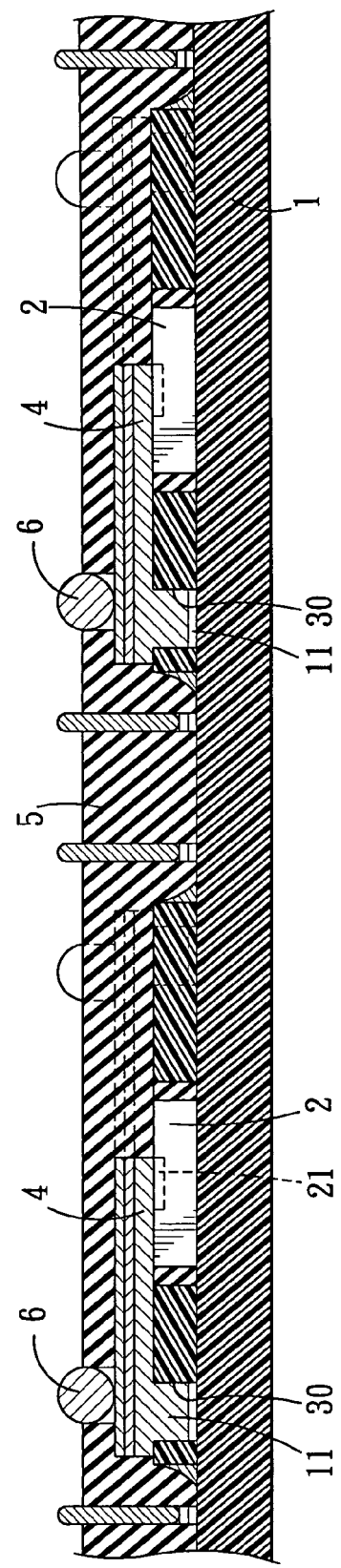
FIG. 6 is a schematic view showing a modified semiconductor device that is modified from that shown in FIG. 5.
Figure 7:
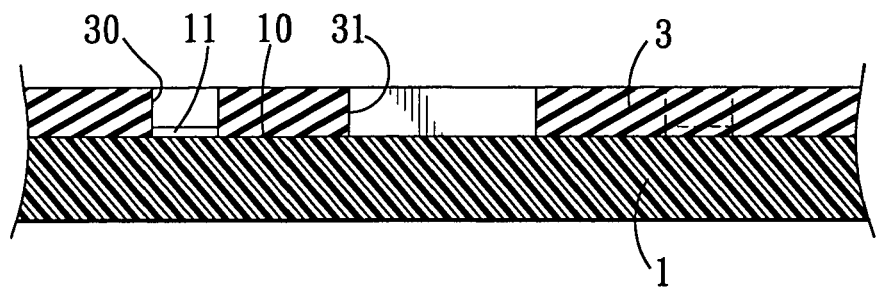
FIG. 7 is a schematic view to illustrate how a dielectric interposer is formed on a die-mounting substrate for forming a semiconductor device according to the second preferred embodiment of the method of this invention.
Figure 8:
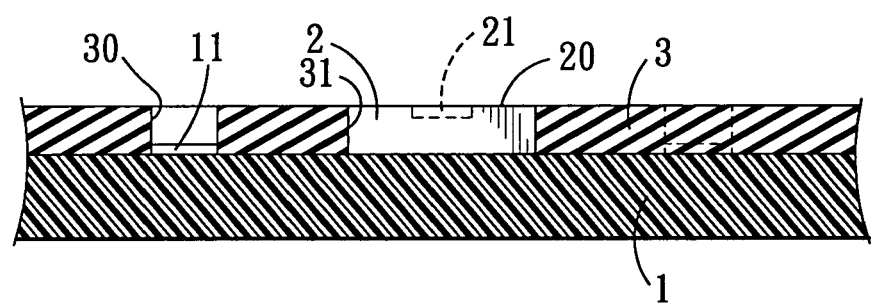
FIG. 8 is a schematic view to illustrate how a semiconductor die is mounted in a through-hole in the interposer of FIG. 7 according to the second preferred embodiment of this invention.
Figure 9:
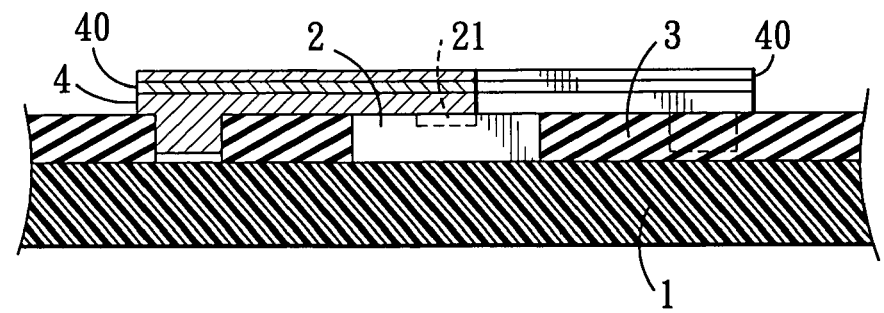
FIG. 9 is a schematic view to illustrate how a conductive strip is formed on the die and the interposer of FIG. 8 according to the second preferred embodiment of this invention.
Figure 10:
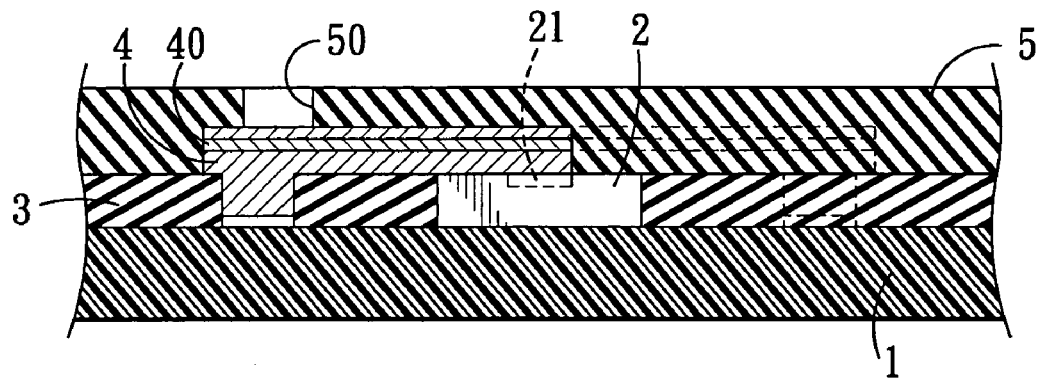
FIG. 10 is a schematic view to illustrate how an encapsulant layer is formed on the assembly of FIG. 9 according to the second preferred embodiment of this invention.
Figure 11:
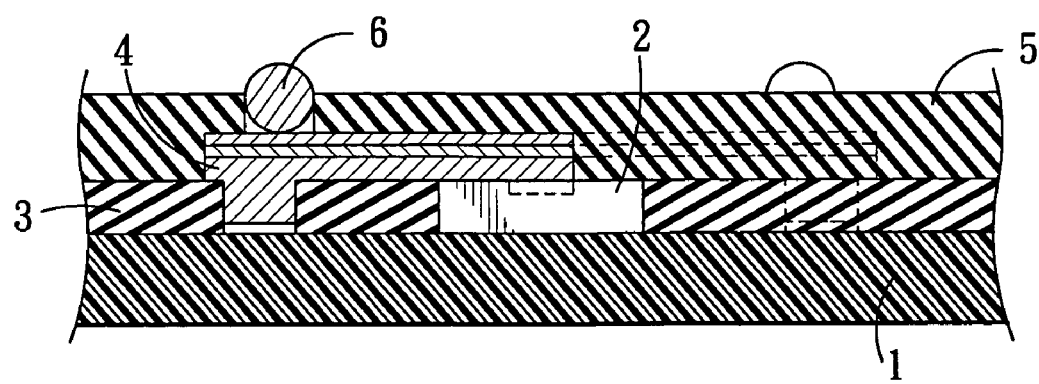
FIG. 11 is a schematic view to illustrate how a solder bump is formed on the encapsulant and is electrically connected to the conductive strip according to the second preferred embodiment of this invention.

FIG. 6 illustrates a modified semiconductor device formed according to the first embodiment of this invention. The modified semiconductor device includes two semiconductor dies 2 on a die-mounting substrate 1.

FIGS. 7 to 11 illustrate consecutive steps of forming a semiconductor device according to the second preferred embodiment of the method of this invention. Unlike the previous embodiment, the interposer 3, which is preferably made from photo ink or polyimide, is formed on the die-mounting substrate 1 prior to the attachment of the semiconductor die 2 to the die-mounting substrate 1 (see FIG. 7), and is patterned and etched to form the pad-through-hole 31 for receiving the semiconductor die 2 therein (see FIG. 8), and the contact-through-holes 30. Subsequent steps of formation of the conductive strips 4, the encapsulant layer 5, and the solder bumps 6 (see FIGS. 9 to 11) are similar to those of the previous embodiment.

Figure 12:
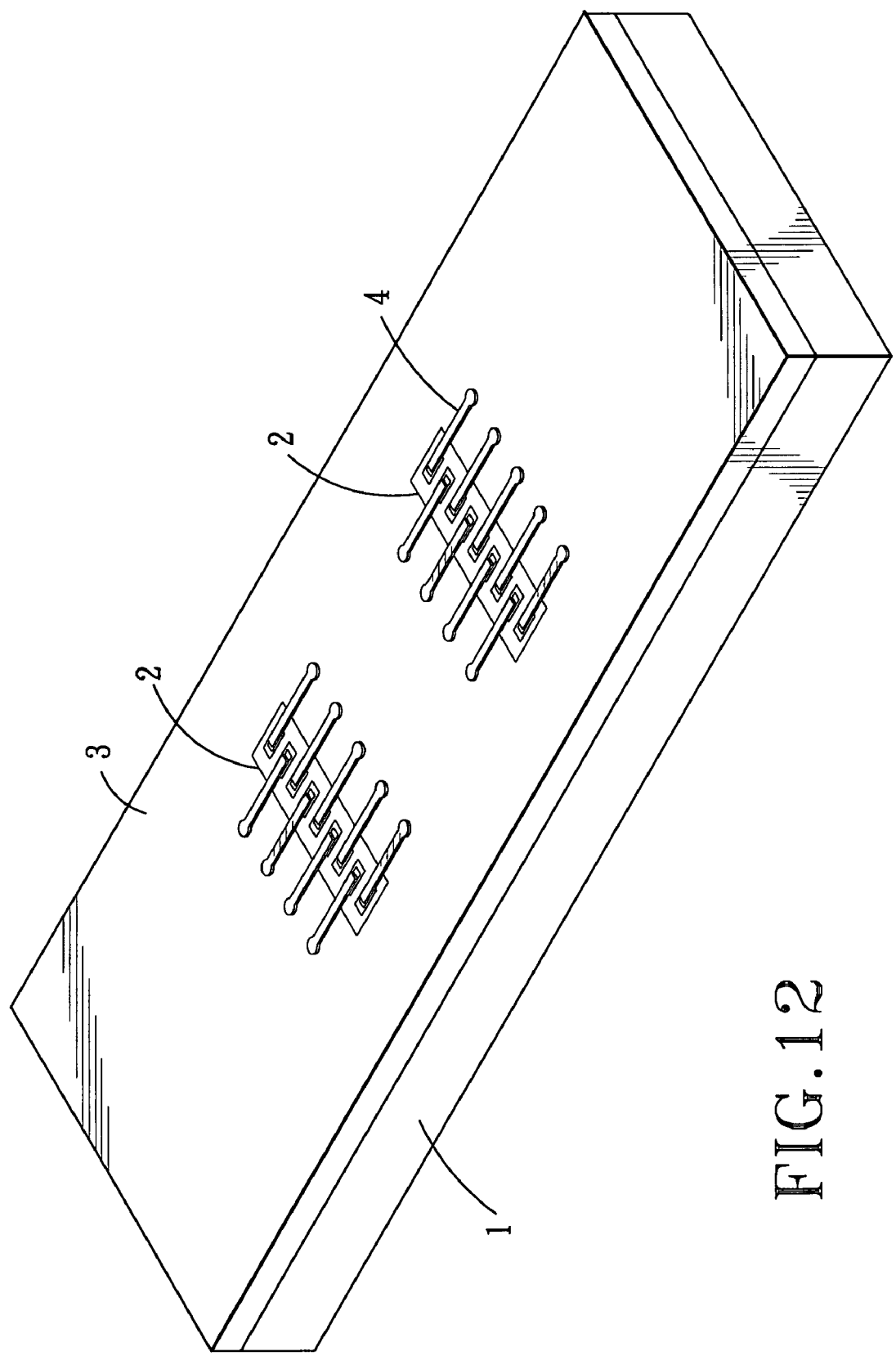
FIG. 12 is a schematic perspective view of the semiconductor device formed according to the second preferred embodiment of this invention, with the encapsulant layer removed for the sake of clarity.
Figure 13:
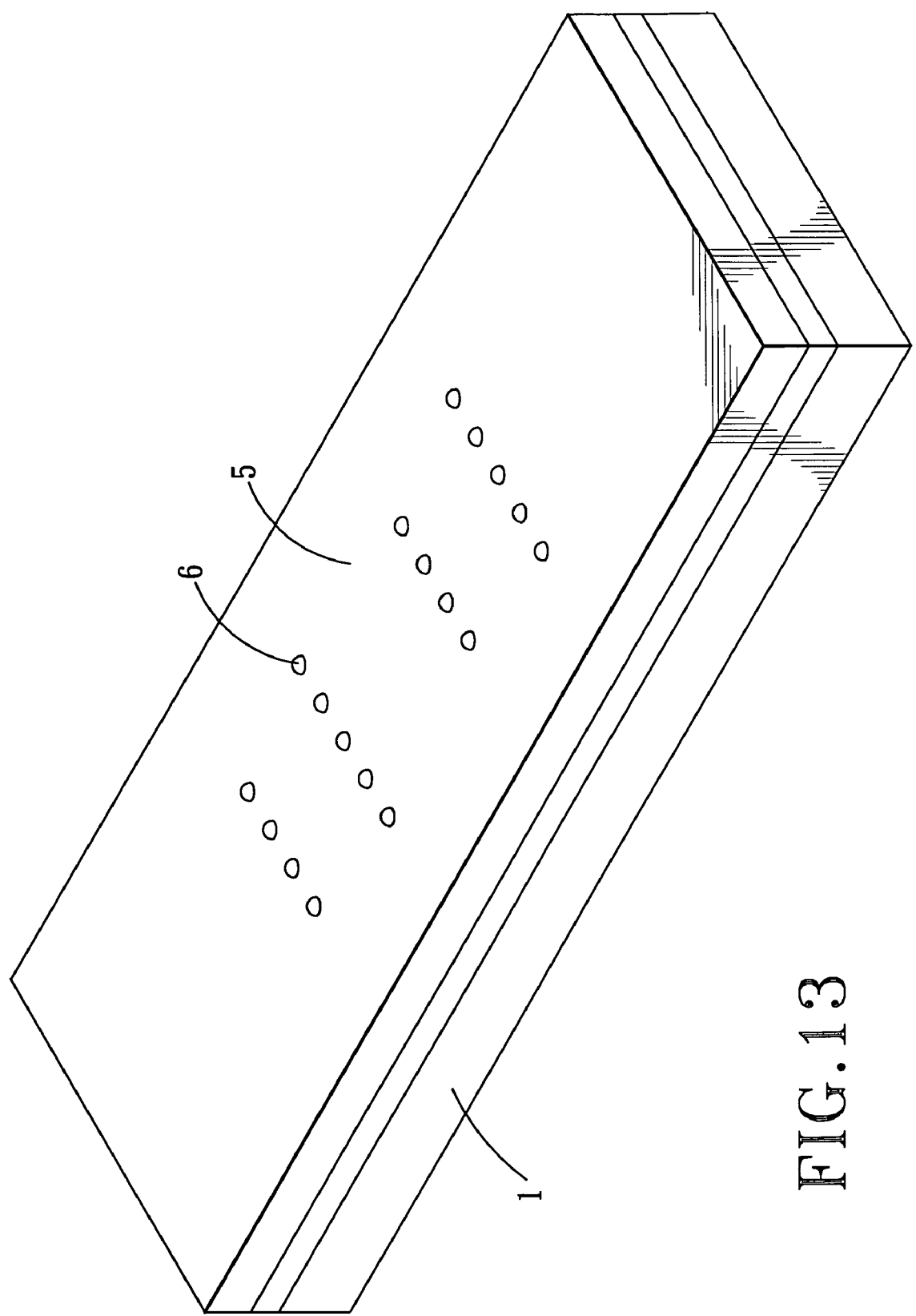
FIG. 13 is a perspective view of the semiconductor device formed according to the second preferred embodiment of this invention.

FIGS. 12 and 13 are perspective views to illustrate the semiconductor device formed according to the second preferred embodiment of the method of this invention. FIG. 12 shows the semiconductor device with the encapsulant layer 5 removed for the sake of clarity. FIG. 13 shows the semiconductor device with the encapsulant layer 5. Two of the semiconductor dies 2 are built into the semiconductor device.

FIGS. 14 to 18 illustrate consecutive steps of forming a semiconductor device according to the third preferred embodiment of the method of this invention.

Figure 14:
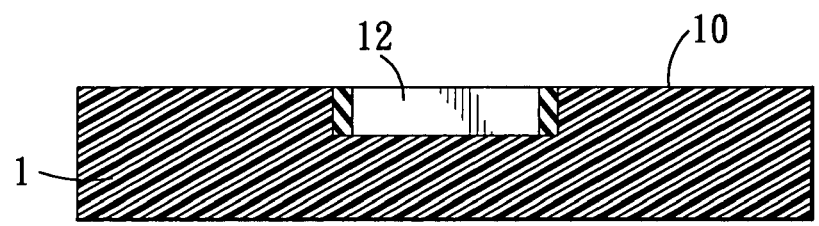
FIG. 14 is a schematic view to illustrate how a die-mounting recess is formed in a die-mounting substrate for forming a semiconductor device according to the third preferred embodiment of this invention.
Figure 15:
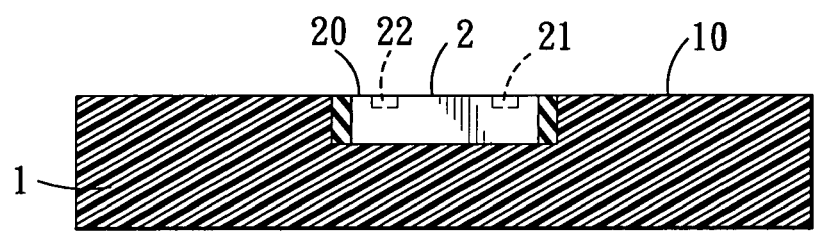
FIG. 15 is a schematic view to illustrate how a semiconductor die is mounted in the die-mounting recess according to the third preferred embodiment of this invention.
Figure 16:
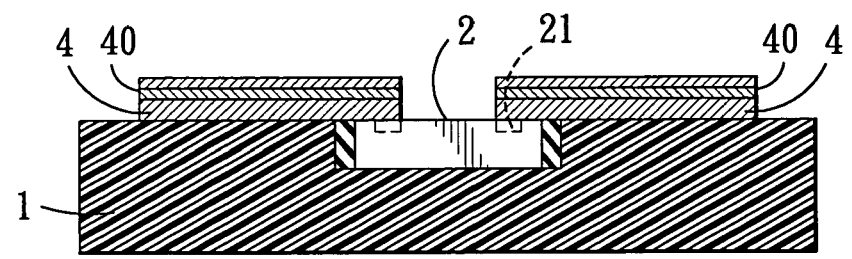
FIG. 16 is a schematic view to illustrate how conductive strips are formed on the die-mounting substrate and the semiconductor die according to the third preferred embodiment of this invention.
Figure 17:
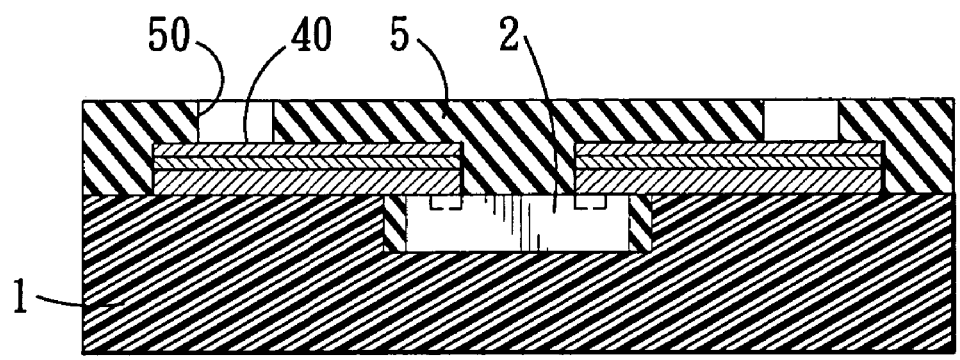
FIG. 17 is a schematic view to illustrate how an encapsulant layer is formed on the assembly of FIG. 16 according to the third preferred embodiment of this invention.
Figure 18:
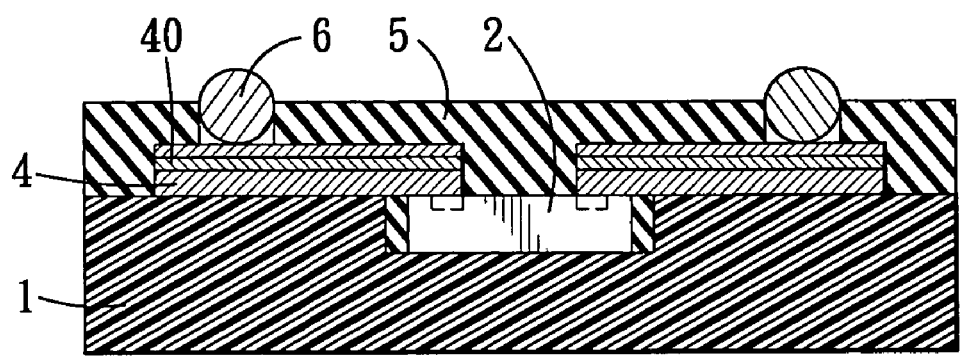
FIG. 18 is a schematic view to illustrate how solder bumps are formed on the encapsulant layer and are electrically and respectively connected to the conductive strips according to the third preferred embodiment of this invention.

Unlike the first preferred embodiment, the die-mounting substrate 1 is formed with a die-mounting recess 12 for receiving the semiconductor die 2, such as a CPU or a chip set therein, (see FIGS. 14 and 15). The interposer 3 is eliminated in this embodiment. Subsequent steps of formation of the conductive strips 4, the encapsulant layer 5, and the solder bumps 6 (see FIGS. 16 to 18) are similar to those of the first embodiment.

Figure 19:
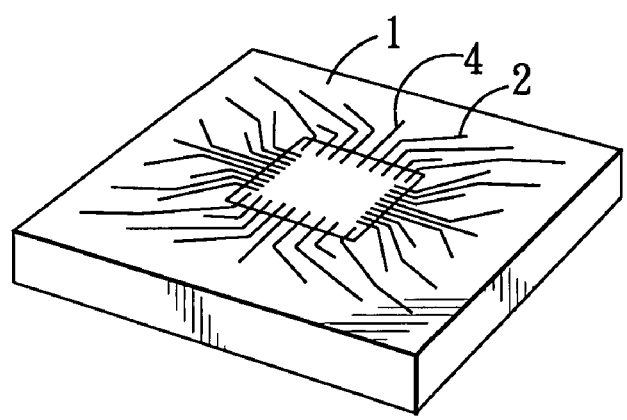
FIG. 19 is a perspective view of the semiconductor device formed according to the third preferred embodiment of this invention, with the encapsulant layer removed for the sake of clarity.
Figure 20:
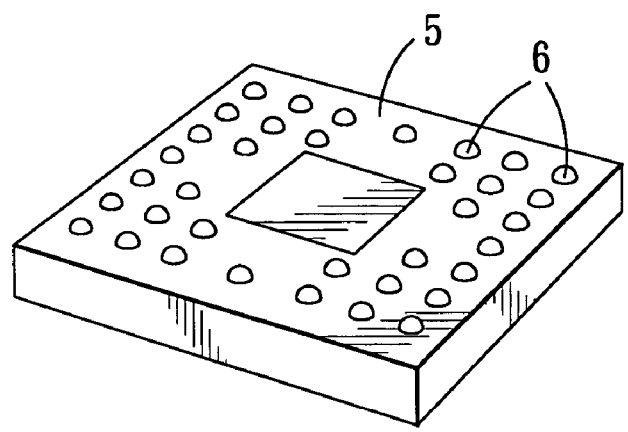
FIG. 20 is a schematic perspective view of the semiconductor device formed according to the third preferred embodiment of this invention.
Figure 21:
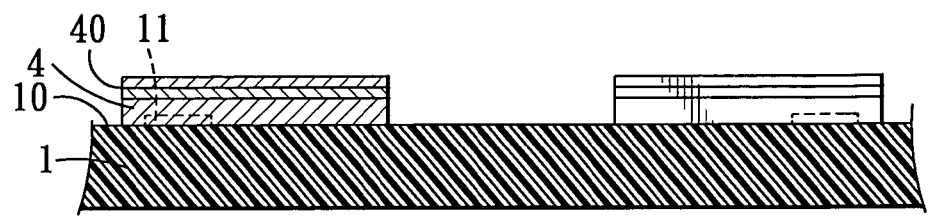
FIG. 21 is a schematic view to illustrate how a first conductive strip is formed on a die-mounting substrate for forming a semiconductor device according to the fourth preferred embodiment of this invention.
Figure 22:
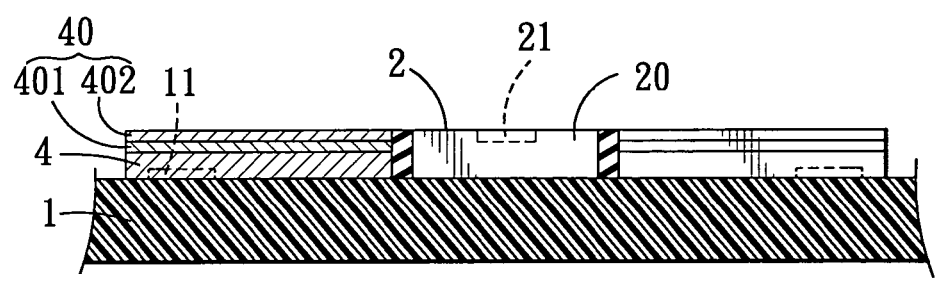
FIG. 22 is a schematic view to illustrate how a semiconductor die is attached to a die-mounting substrate according to the fourth preferred embodiment of this invention.
Figure 23:
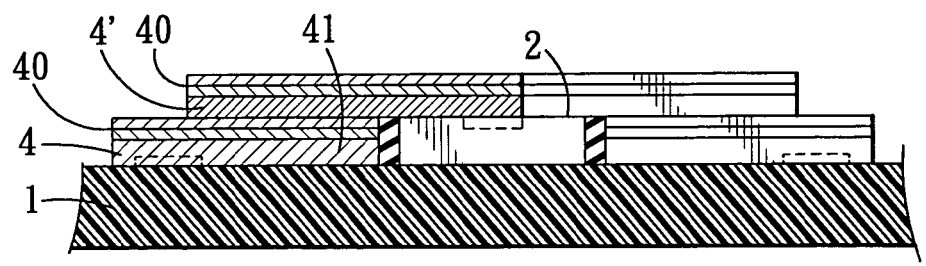
FIG. 23 is a schematic view to illustrate how a second conductive strip is formed on the die and the first conductive strip according to the fourth preferred embodiment of this invention.
Figure 24:
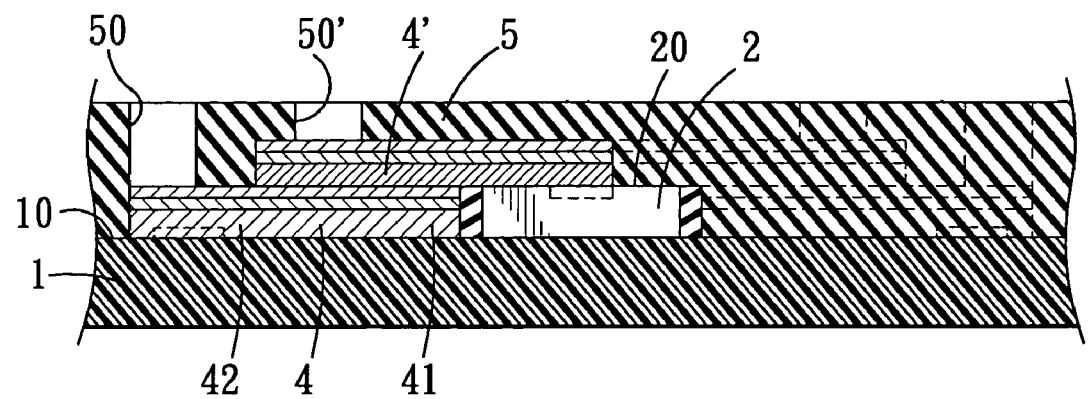
FIG. 24 is a schematic view to illustrate how an encapsulant is formed on the assembly of FIG. 23 according to the fourth preferred embodiment of this invention.
Figure 25:
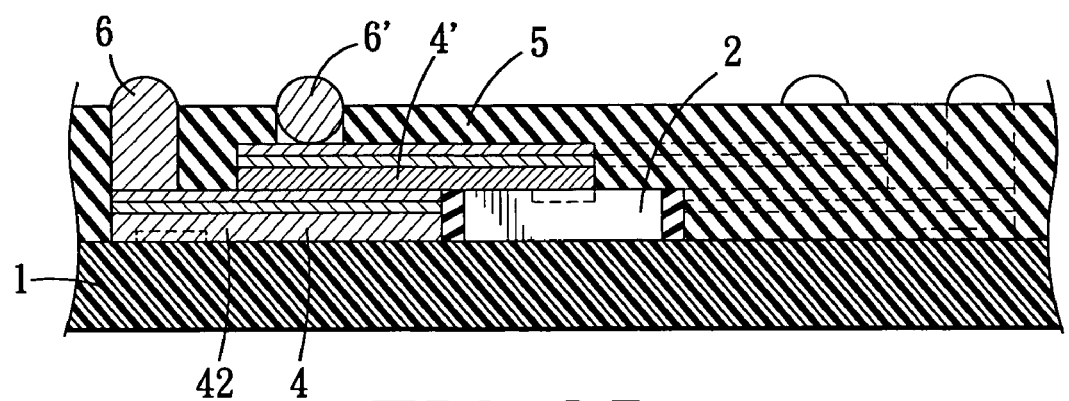
FIG. 25 is a schematic view to illustrate how first and second solder bumps are formed on the encapsulant and are electrically and respectively connected to the first and second conductive strips according to the fourth preferred embodiment of this invention.
Figure 26:
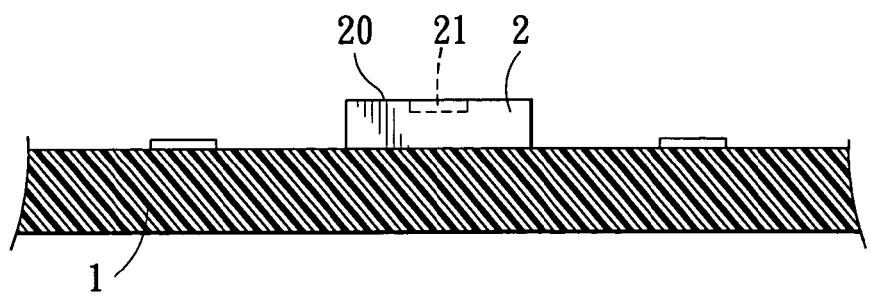
FIG. 26 is a schematic view to illustrate how a first semiconductor die is attached to a die-mounting substrate for forming a semiconductor device according to the fifth preferred embodiment of a method of this invention.
Figure 27:
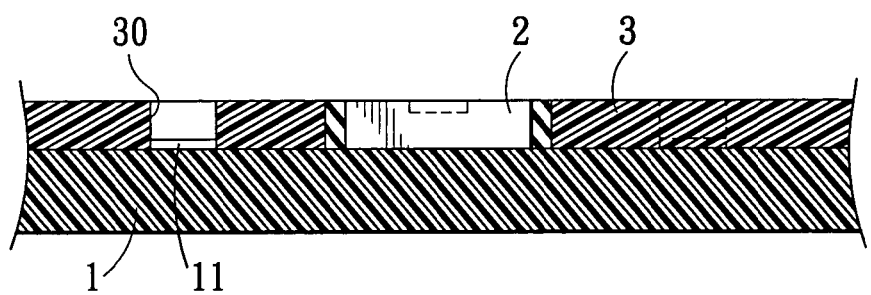
FIG. 27 is a schematic view to illustrate how a dielectric interposer is provided on the die-mounting substrate according to the fifth preferred embodiment of this invention.
Figure 28:
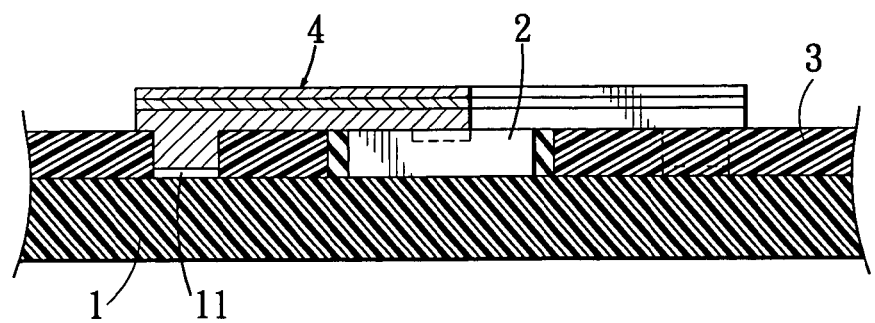
FIG. 28 is a schematic view to illustrate how a first conductive strip is formed on the first semiconductor die and the interposer according to the fifth preferred embodiment of this invention.
Figure 29:
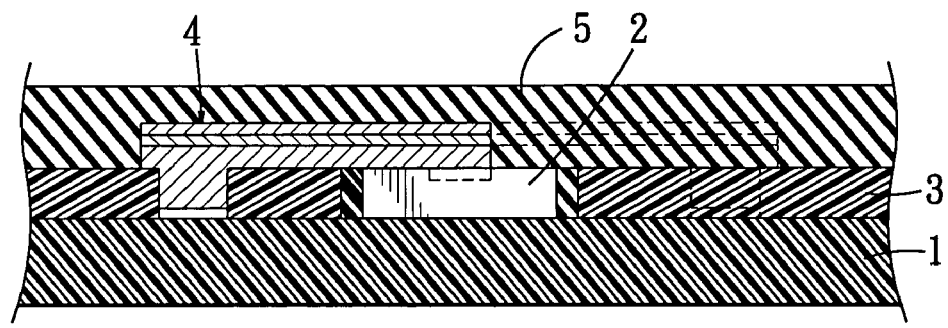
FIG. 29 is a schematic view to illustrate how a first encapsulant layer is formed on the assembly of FIG. 28 according to the fifth preferred embodiment of this invention.
Figure 30:
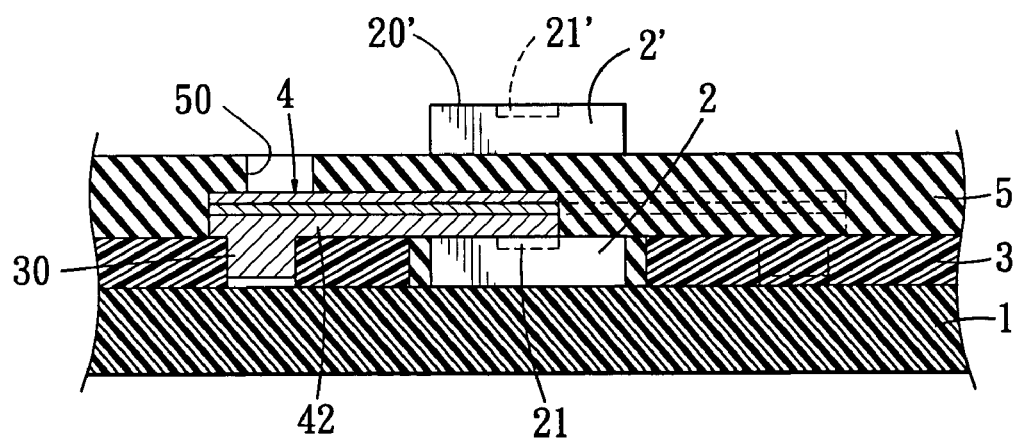
FIG. 30 is a schematic view to illustrate how a second semiconductor die is attached to the first encapsulant layer according to the fifth preferred embodiment of this invention.
Figure 31:
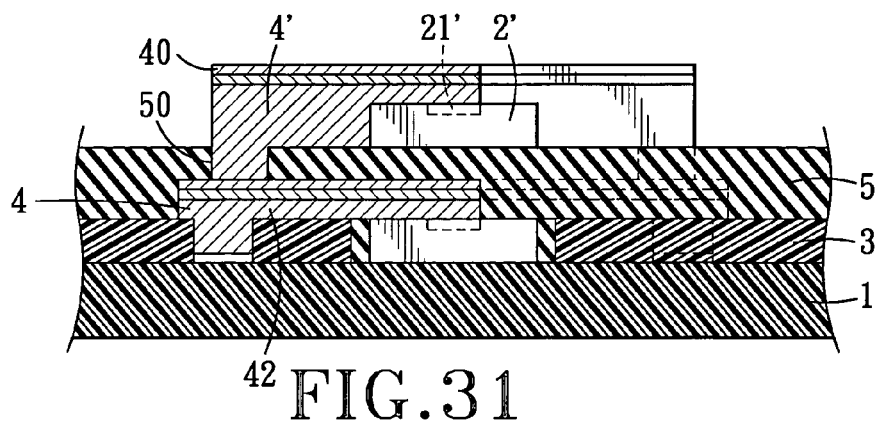
FIG. 31 is a schematic view to illustrate how a second conductive strip is formed on the second semiconductor die and is electrically connected to the first conductive strip according to the fifth preferred embodiment of this invention.
Figure 32:
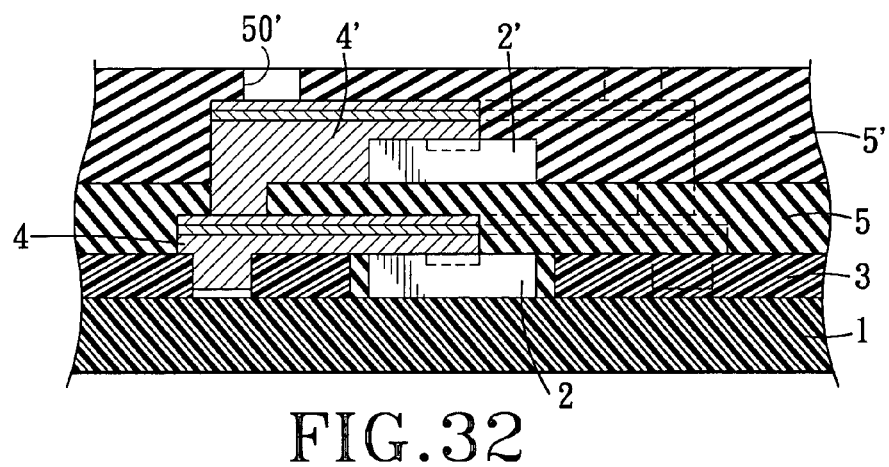
FIG. 32 is a schematic view to illustrate how a second encapsulant layer is formed on the assembly of FIG. 31 according to the fifth preferred embodiment of this invention.
Figure 33:
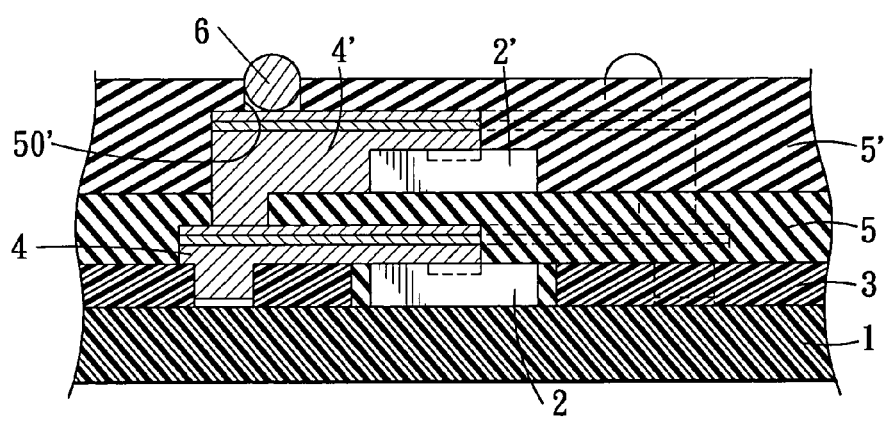
FIG. 33 is a schematic view to illustrate how a solder bump is formed on the second encapsulant layer and is electrically connected to the second conductive strip according to the fifth preferred embodiment of this invention.
Figure 34:
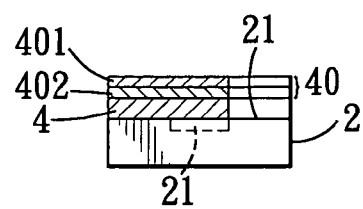
FIG. 34 is a schematic view to illustrate how a first conductive strip is formed on a semiconductor die for forming a semiconductor device according to the sixth preferred embodiment of this invention.
Figure 35:
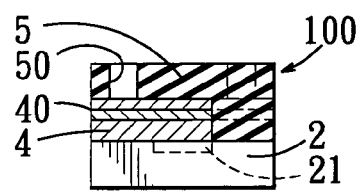
FIG. 35 is a schematic view to illustrate how a first encapsulant layer is formed on the first conductive strip and the semiconductor die to form a semi-package according to the sixth preferred embodiment of this invention.
Figure 36:
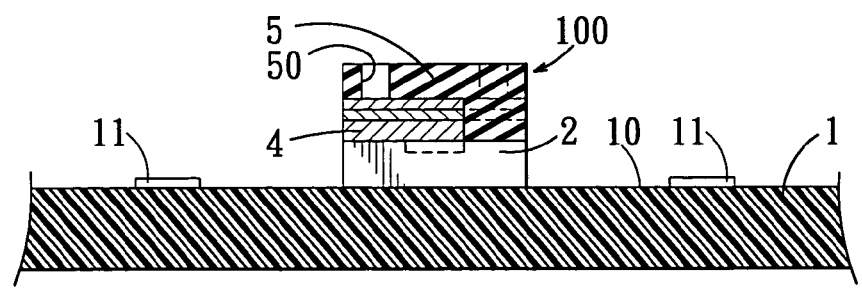
FIG. 36 is a schematic view to illustrate how the semi-package is attached to a die-mounting substrate according to the sixth preferred embodiment of this invention.
Figure 37:
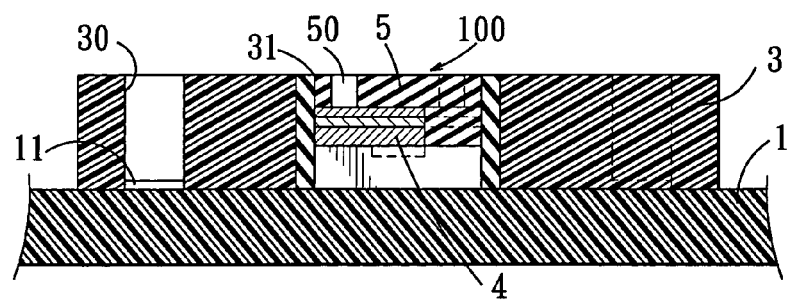
FIG. 37 is a schematic view to illustrate how an interposer is formed on the semi-package according to the sixth preferred embodiment of this invention.
Figure 38:
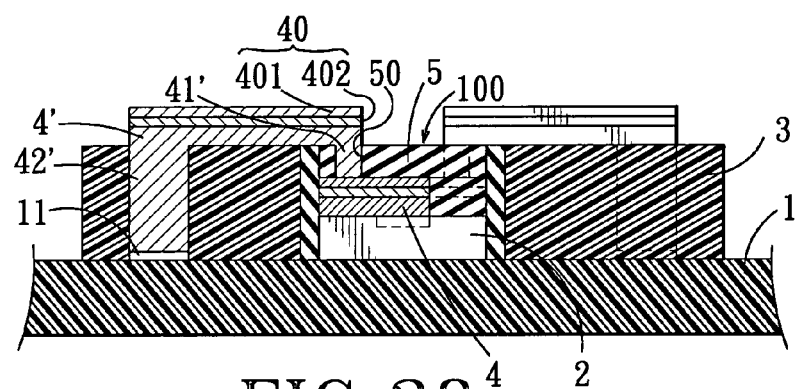
FIG. 38 is a schematic view to illustrate how a second conductive strip is formed on the interposer according to the sixth preferred embodiment of this invention.
Figure 39:
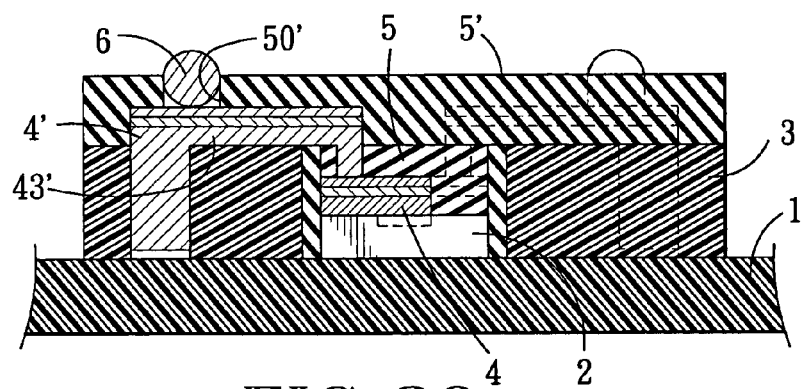
FIG. 39 is a schematic view to illustrate how a second encapsulant layer is formed on the assembly of FIG. 38 and how a solder bump is formed on the second encapsulant layer and is electrically connected to the second conductive strip according to the sixth preferred embodiment of this invention.

FIGS. 19 and 20 illustrate the semiconductor device formed according to the third preferred embodiment. FIG. 19 shows the semiconductor device with the encapsulant layer 5 removed. FIG. 20 shows the semiconductor device with the encapsulant layer 5 and the solder bumps 6

FIGS. 21 to 25 illustrate consecutive steps of forming a semiconductor device according to the fourth preferred embodiment of the method of this invention. The method of this embodiment includes the steps of: preparing a die-mounting substrate 1 that has a die-mounting surface 10 and that is formed with a plurality of conductive contacts 11 on the die-mounting surface 10 (see FIG. 21); forming a plurality of first conductive strips 4 on the die-mounting surface 10 (see FIG. 22), each of the first conductive strips 4 being electrically connected to and extending from a respective one of the contacts 11 in a lateral direction relative to the die-mounting surface 10; preparing a semiconductor die 2 that has a pad-mounting surface 20, and that is formed with a plurality of spaced apart bonding pads 21 on the pad-mounting surface 20 (see FIG. 22); attaching the semiconductor die 2 to the die-mounting surface 10; forming a plurality of second conductive strips 4' (see FIG. 23), each of which is formed on the pad-mounting surface 20 and each of which is electrically connected to and extends from a respective one of the bonding pads 21 in the lateral direction to connect electrically with a first portion 41 of a respective one of the first conductive strips 4; forming an encapsulant layer 5 on the die-mounting surface 10, the first and second conductive strips 4, 4', and the pad-mounting surface 20 of the die 2 (see FIG. 24); patterning and etching the encapsulant layer 5 to form a plurality of first and second bump-through-holes 50, 50' in the encapsulant layer 5 in such a manner that each of the first bump-through-holes 50 exposes a second portion 42 of a respective one of the first conductive strips 4 therefrom, and that each of the second bump-through-holes 50' exposes a portion of a respective one of the second conductive strips 4' therefrom, the first and second portions 41, 42 of each of the first conductive strips 4 being offset from each other in the lateral direction (see FIG. 24); and forming a plurality of first and second solder bumps 6, 6' (see FIG. 25) in such a manner that each of the first solder bumps 6 fills a respective one of the first bump-through-holes 50 to connect electrically with the second portion 42 of a respective one of the first conductive strips 4 and protrudes outwardly from the encapsulant layer 5, and that each of the second solder bumps 6' fills a respective one of the second bump-through-holes 50' to connect electrically with the exposed portion of a respective one of the second conductive strips 4' and protrudes outwardly from the encapsulant layer 5. Each of the first and second conductive strips 4, 4' includes a metal layer 40 that is electrically connected to a respective one of the first and second solder bumps 6, 6'. Each metal layer 40 includes a nickel sub-layer 401 and a gold sub-layer 402 (see FIG. 22).

FIGS. 26 to 33 illustrate consecutive steps of forming a semiconductor device according to the fifth preferred embodiment of the method of this invention. FIGS. 26 to 30 illustrate steps that are similar to those of FIGS. 1 to 4. However, unlike the first preferred embodiment, a second semiconductor die 2' is attached to the encapsulant layer 5 (see FIG. 30), and a plurality of second conductive strips 4' (see FIG. 31) and a second encapsulant layer 5' (see FIG. 32) are subsequently formed on the encapsulant layer 5 prior to the formation of the solder bumps 6 (see FIG. 33). The encapsulant layer 5 is formed with a plurality of strip-through-holes 50, each of which exposes a portion of the trace part 42 of a respective one of the first conductive strips 4 therefrom (see FIG. 30). Each of the second conductive strips 4' is formed on the first encapsulant layer 5, is electrically connected to a respective one of the bonding pads 21' of the second semiconductor die 2', and fills a respective one of the strip-through-holes 50 to connect electrically with the exposed portion of the trace part 42 of a respective one of the first conductive strips 4 (see FIG. 31). The second encapsulant layer 5' is formed on the first encapsulant layer 5, the second semiconductor die 2', and the second conductor strips 4', and is patterned and etched to form a plurality of bump-through-holes 50' in the second encapsulant layer 5' in such a manner that each of the bump-through-holes 50' exposes a portion of a respective one of the second conductive strips 4' (see FIG. 32). Each of the solder bumps 6 fills a respective one of the bump-through-holes 50' to connect electrically with a respective one of the second conductive strips 4'.

FIGS. 34 to 39 illustrate consecutive steps of forming a semiconductor device according to the sixth preferred embodiment of the method of this invention. The method of this embodiment includes preparation of a die-mounting substrate 1 that has a die-mounting surface 10 and that is formed with a plurality of conductive contacts 11 on the die-mounting surface 10 (see FIG. 36). A semiconductor semi-package 100 is prepared by the following steps: preparing a semiconductor die 2 that has a pad-mounting surface 20, and that is formed with a plurality of spaced apart bonding pads 21 on the pad-mounting surface 20 (see FIG. 34); forming a plurality of first conductive strips 4, each of which is formed on the pad-mounting surface 20 and each of which is electrically connected to and extends from a respective one of the bonding pads 21 in a lateral direction relative to the pad-mounting surface 20 (see FIG. 34); forming a first encapsulant layer 5 on the pad-mounting surface 20 and the first conductive strips 4; and patterning and etching the first encapsulant layer 5 to form a plurality of strip-through-holes 50 in the first encapsulant layer 5 in such a manner that each of the strip-through-holes 50 exposes a portion of a respective one of the first conductive strips 4 therefrom. The method further includes the steps of: attaching the semi-package 100 to the die-mounting surface 10 (see FIG. 36); forming a dielectric interposer 3 with a die-through-hole 31 and a plurality of contact-through-holes 30 on the die-mounting surface 10 in such a manner that the die-through-hole 31 receives the semi-package 100 therein and exposes the semi-package 100 therefrom, and that each of the contact-through-holes 30 is registered with a respective one of the contacts 11 and exposes the respective one of the contacts 11 therefrom, the interposer 3 being in the form of a resin packaging substrate; forming a plurality of second conductive strips 4' on the interposer 3 and the semi-package 100 in such a manner that each of the second conductive strips 4' has a first portion 41' that fills a respective one of the strip-through-holes 50 in the first encapsulant layer 5 to connect electrically with the exposed portion of a respective one of the first conductive strips 4, and a second portion 42' that fills a respective one of the-contact-through-holes 30 to connect electrically with a respective one of the contacts 11; forming a second encapsulant layer 5' on the interposer 3, the second conductive strips 4' and the semi-package 100; patterning and etching the second encapsulant layer 5' to form a plurality of bump-through-holes 50' in the second encapsulant layer 5' in such a manner that each of the bump-through-holes 50' exposes a third portion 43' of a respective one of the second conductive strips 4' therefrom; and forming a plurality of solder bumps 6, each of which fills a respective one of the bump-through-holes 50' to connect electrically with the third portion 43' of a respective one of the second conductive strips 4' and each of which protrudes outwardly from the second encapsulant layer 5'. Similar to the previous embodiments, each of the first and second conductive strips 4, 4' includes a metal layer 40 that has a nickel sub-layer 401 and a gold sub-layer 402.

Figure 40:
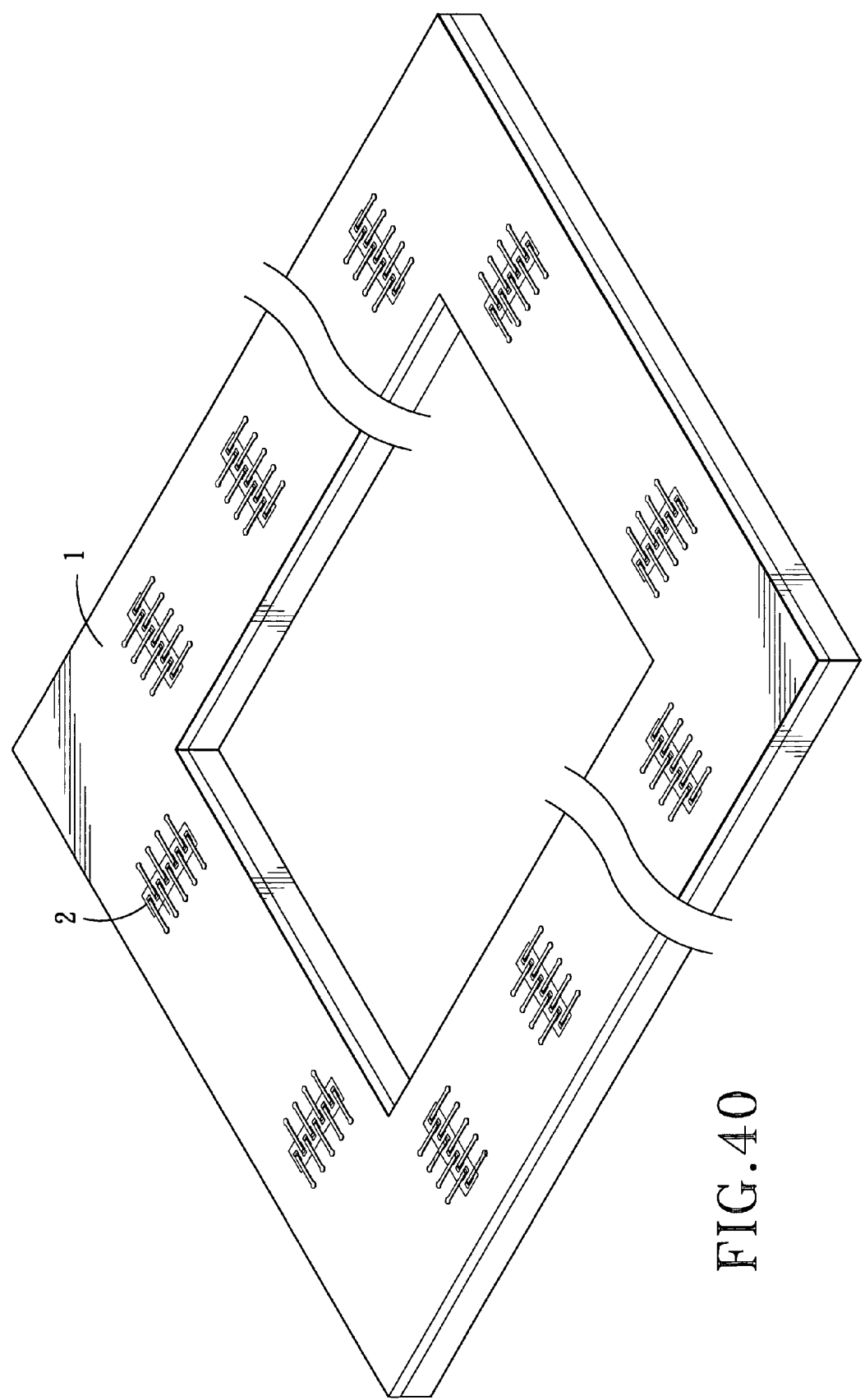
FIG. 40 is a perspective view to illustrate a semiconductor device formed according to the second preferred embodiment, with the encapsulant layer removed for the sake of clarity.

FIG. 40 shows a semiconductor device with the encapsulant layer 5 removed to illustrate an inner structure thereof. The device includes a plurality of semiconductor dies 2 attached to a die-mounting substrate 1.

Figure 41:
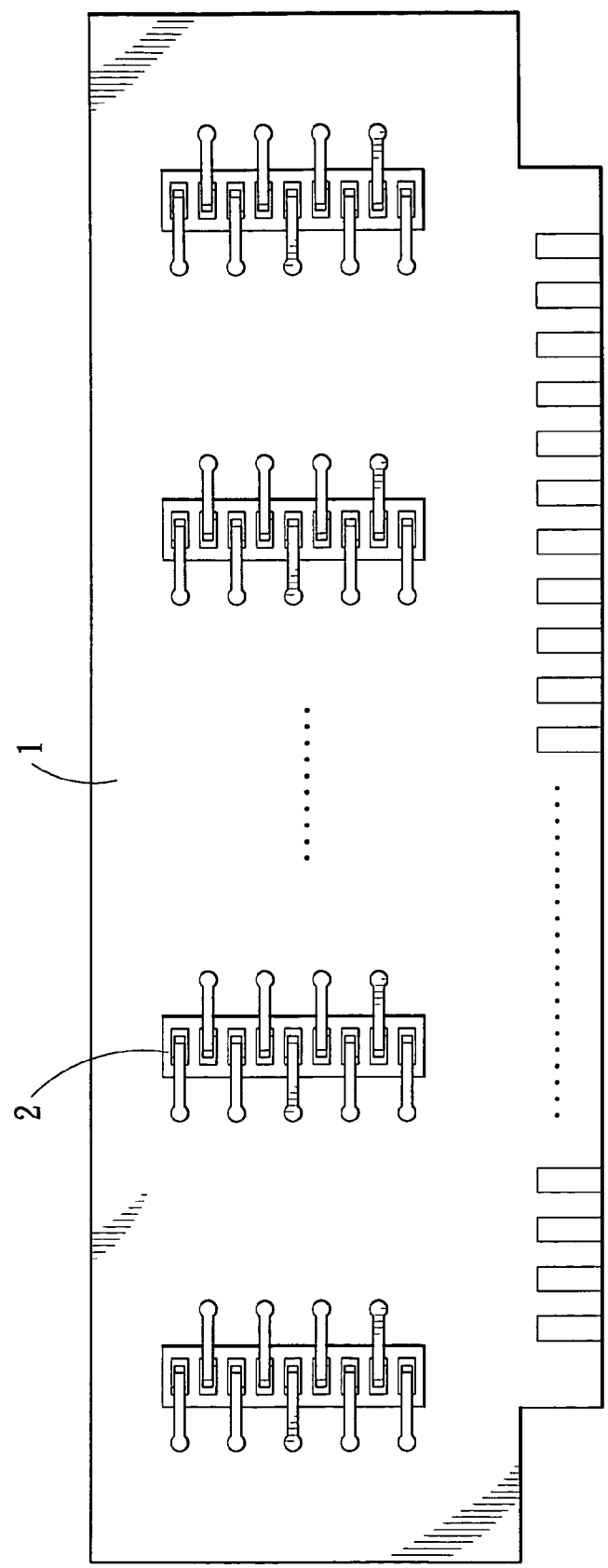
FIG. 41 is a perspective view to illustrate a memory device formed according to the second preferred embodiment, with the encapsulant layer removed for the sake of clarity.

FIG. 41 shows a memory device with the encapsulant layer 5 removed to illustrate an inner structure thereof. The device includes a plurality of semiconductor dies 2 attached to a die-mounting substrate 1.

Figure 42:
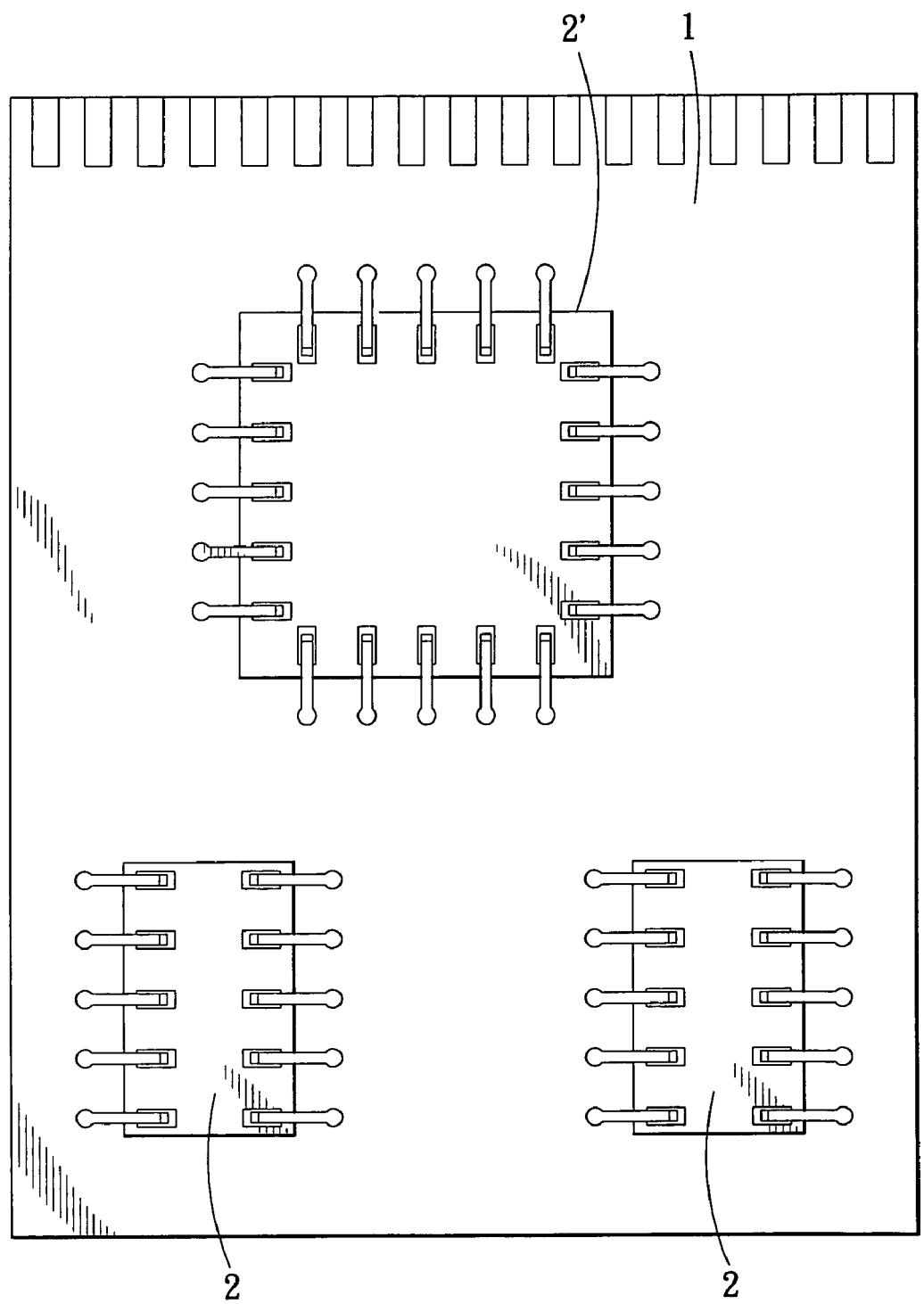
FIG. 42 is a schematic perspective view to illustrate a flash memory device formed according to the second preferred embodiment, with the encapsulant layer being removed.

FIG. 42 shows a flash memory device with the encapsulant layer 5 removed to illustrate an inner structure thereof. The device includes a plurality of memory dies 2 and a controller die 2' attached to a die-mounting substrate 1.

FIGS. 43 to 46 illustrate consecutive steps of forming a semiconductor device according to the seventh preferred embodiment of the method of this invention. Unlike the first embodiment, the interposer 3, which is preferably made from photo ink or polyimide, is formed on the die-mounting substrate 1 (which is a glass back plate for a display panel) prior to the attachment of the semiconductor die 2 to the die-mounting substrate 1 (see FIG. 43), and is patterned and etched to form the pad-through-hole 31 for receiving the semiconductor die 2 therein (see FIG. 44), and the contact-through-holes 30 for exposing the contacts 11 (which are electrically connected to the display panel) on the die-mounting surface 10. A plurality of conductive strips 4 (only one is shown) are formed on the interposer 3 (see FIG. 45), and are connected to the bonding pads 21, respectively. Each of the conductive strips 4 extends from the respective bonding pads 21 to a respective one of the contact-through-holes 30, and fills the respective one of the contact-through-holes 30 to connect electrically a respective one of the contacts 11. Each of the conductive strips 4 is formed with a metal layer 40. An encapsulant layer 5 is subsequently formed on the interposer 3 and the conductive strips 4 (see FIG. 46).

With the invention thus explained, it is apparent that various modifications and variations can be made without departing from the spirit of the present invention. It is therefore intended that the invention be limited only as recited in the appended claims.

I claim:

1. A semiconductor device comprising:
   a die-mounting substrate having a die-mounting surface and formed with at least one conductive contact on said die-mounting surface;
   at least one semiconductor die attached to said die-mounting surface, having a pad-mounting surface opposite to said die-mounting surface, and formed with at least one bonding pad on said pad-mounting surface;
   a dielectric interposer provided on said die-mounting surface and formed with at least one pad-through-hole and at least one contact-through-hole, said pad-through-hole receiving said die therein and exposing said pad-mounting surface therefrom, said contact-through-hole being registered with said contact and exposing said contact therefrom;
   at least one conductive strip formed on said pad-mounting surface and said interposer, said conductive strip having a pad-connecting part that is electrically connected to and that extends from said bonding pad, and a trace part that extends from said pad-connecting part to connect electrically with said contact;
   an encapsulant layer formed on said die-mounting surface, said interposer, said conductive strip, and said pad-mounting surface of said die, and formed with at least one bump-through-hole which exposes a portion of said trace part of said conductive strip therefrom; and
   at least one solder bump which fills said bump-through-hole to connect electrically with said portion of said trace part of said conductive strip and which protrudes outwardly from said encapsulant layer.

2. The semiconductor device of claim 1, wherein said conductive strip is made from conductive paste.

3. The semiconductor device of claim 1, wherein said die-mounting substrate is a rigid substrate, and is made from a material that is selected from a group consisting of polyimide, glass, and ceramic.

4. The semiconductor device of claim 1, wherein said die-mounting substrate is a printed circuit board.

5. The semiconductor device of claim 1, wherein said trace part of said conductive strip has a metal layer that is electrically connected to said solder bump and that includes a nickel sub-layer and a gold sub-layer.

6. The semiconductor device of claim 1, wherein said encapsulant layer is made from a material that is selected from a group consisting of photo ink and polyimide.

7. The semiconductor device of claim 1, wherein said interposer is a resinous packaging substrate.

8. The semiconductor device of claim 1, wherein said interposer is made from a material that is selected from a group consisting of photo ink and polyimide.

9. A semiconductor device comprising:
   a die-mounting substrate having a die-mounting surface that is indented to form at least one die-mounting recess;
   at least one semiconductor die received in said die-mounting recess, having a pad-mounting surface that is exposed from said die-mounting recess, and formed with at least one bonding pad on said pad-mounting surface;
   at least one conductive strip formed directly on said pad-mounting surface and said die-mounting surface, said conductive strip having a pad-connecting part that is electrically connected to and that extends from said bonding pad, and a trace part that extends from said pad-connecting part in a lateral direction relative to said die-mounting surface and that is formed on said die-mounting surface;
   an encapsulant layer formed on said die-mounting surface, said conductive strip, and said pad-mounting surface of said die, and formed with at least one bump-through-hole which exposes a portion of said trace part of said conductive strip therefrom; and
   at least one solder bump which fills said bump-through-hole to connect electrically with said portion of said trace part of said conductive strip and which protrudes outwardly from said encapsulant layer.

10. The semiconductor device of claim 9, wherein said conductive strip is made from conductive paste.

11. The semiconductor device of claim 9, wherein said trace part of said conductive strip has a metal layer that is electrically connected to said solder bump and that includes a nickel sub-layer and a gold sub-layer.

12. A semiconductor device comprising:
   a die-mounting substrate having a die-mounting surface and formed with at least one conductive contact on said die-mounting surface;
   at least one first conductive strip formed on said die-mounting surface, said first conductive strip being electrically connected to and extending from said contact in a lateral direction relative to said die-mounting surface;
   at least one semiconductor die attached to said die-mounting surface, having a pad-mounting surface opposite to said die-mounting surface, and formed with at least one bonding pad on said pad-mounting surface;
   at least one second conductive strip which is formed on said pad-mounting surface and which is electrically connected to and which extends from said bonding pad in said lateral direction to connect electrically with a first portion of said first conductive strip;
   an encapsulant layer formed on said die-mounting surface, said first and second conductive strips, and said pad-mounting surface of said die, and formed with first and second bump-through-holes, said first bump-through-hole exposing a second portion of said first conductive strip therefrom, said second bump-through-hole exposing a portion of said second conductive strip therefrom, said first and second portions of said first conductive strip being offset from each other in said lateral direction; and
   first and second solder bumps, said first solder bump filling said first bump-through-hole to connect electrically with said second portion of said first conductive strip and protruding outwardly from said encapsulant layer, said second solder bump filling said second bump-through-hole to connect electrically with said portion of said second conductive strip and protruding outwardly from said encapsulant layer.

13. The semiconductor device of claim 12, wherein said first conductive strip has a first metal layer that is electrically connected to said first solder bump and that includes a nickel sub-layer and a gold sub-layer.

14. The semiconductor device of claim 12, wherein said second conductive strip has a second metal layer that is electrically connected to said second solder bump and that includes a nickel sub-layer and a gold sub-layer.

15. A semiconductor device comprising:
a die-mounting substrate having a die-mounting surface and formed with at least one conductive contact on said die-mounting surface;
at least one first semiconductor die attached to said die-mounting surface, having a pad-mounting surface opposite to said die-mounting surface, and formed with at least one bonding pad on said pad-mounting surface;
a dielectric interposer provided on said die-mounting surface and formed with at least one pad-through-hole and at least one contact-through-hole, said pad-through-hole receiving said die therein and exposing said pad-mounting surface therefrom, said contact-through-hole being registered with said contact and exposing said contact therefrom;
at least one first conductive strip formed on said pad-mounting surface of said first semiconductor die and said interposer, said first conductive strip having a pad-connecting part that is electrically connected to and that extends from said bonding pad of said first semiconductor die, and a trace part that extends from said pad-connecting part to connect electrically with said conductive contact;
a first encapsulant layer formed on said die-mounting surface, said interposer, said first conductive strip, and said pad-mounting surface of said first semiconductor die, and formed with at least one strip-through-hole which exposes a portion of said trace part of said first conductive strip therefrom;
at least one second semiconductor die attached to said first encapsulant layer, having a pad-mounting surface, and formed with at least one bonding pad on said pad-mounting surface of said second semiconductor die;
at least one second conductive strip which is formed on said first encapsulant layer, which is electrically connected to said bonding pad of said second semiconductor die, and which fills said strip-through-hole to connect electrically with said portion of said first conductive strip;
a second encapsulant layer formed on said first encapsulant layer, said second semiconductor die, and said second conductor strip, and formed with at least one bump-through-hole which exposes a portion of said second conductive strip; and
at least one solder bump which fills said bump-through-hole to connect electrically with said portion of said second conductive strip and which protrudes outwardly from said second encapsulant layer.

16. The semiconductor device of claim 15, wherein said first conductive strip has a first metal layer that is electrically connected to said second conductive strip and that includes a nickel sub-layer and a gold sub-layer.

17. The semiconductor device of claim 15, wherein said second conductive strip has a second metal layer that is electrically connected to said solder bump and that includes a nickel sub-layer and a gold sub-layer.

18. A semiconductor device comprising:
a die-mounting substrate having a die-mounting surface and formed with at least one conductive contact on said die-mounting surface;
at least one semiconductor semi-package attached to said die-mounting surface, and including
a semiconductor die that is attached to said die-mounting surface, that has a pad-mounting surface opposite to said die-mounting surface, and that is formed with at least one bonding pad on said pad-mounting surface,
at least one first conductive strip which is formed on said pad-mounting surface and which is electrically connected to and which extends from said bonding pad in a lateral direction relative to said pad-mounting surface, and
a first encapsulant layer formed on said pad-mounting surface and said first conductive strip, and formed with at least one strip-through-hole which exposes a portion of said first conductive strip therefrom;
a dielectric interposer provided on said die-mounting surface and formed with at least one die-through-hole and at least one contact-through-hole, said die-through-hole receiving said semi-package therein and exposing said semi-package therefrom, said contact-through-hole being registered with said contact and exposing said contact therefrom;
at least one second conductive strip formed on said interposer and said semi-package, said second conductive strip having a first portion that fills said strip-through-hole to connect electrically with said portion of said first conductive strip, and a second portion that fills said contact-through-hole to conned electrically with said contact
a second encapsulant layer formed on said interposer, said second conductive strip, and said semi-package, and formed with at least one bump-through-hole which exposes a third portion of said second conductive strip therefrom; and
at least one solder bump which fills said bump-through-hole to connect electrically with said third portion of said second conductive strip and which protrudes outwardly from said second encapsulant layer.

19. The semiconductor device of claim 18, wherein said first and second conductive strips are made from conductive paste.

20. The semiconductor device of claim 18, wherein said first conductive strip has a first metal layer that is electrically connected to said second conductive strip and that includes a nickel sub-layer and a gold sub-layer.

21. The semiconductor device of claim 18, wherein said second conductive strip has a second metal layer that is electrically connected to said solder bump and that includes a nickel sub-layer and a gold sub-layer.

22. A method for making a semiconductor device, comprising the steps of:
preparing a die-mounting substrate that has a die-mounting surface and that is formed with at least one conductive contact on said die-mounting surface;
preparing a semiconductor die that has a pad-mounting surface, and at least one bounding pad formed on said pad-mounting surface;
attaching said semiconductor die to said die-mounting surface;
preparing a dielectric interposer that is formed with a pad-through-hole and at least one contact-through-hole;
attaching said interposer to said die-mounting surface in such a manner that said die is received in and has said pad-mounting surface thereof exposed from said pad-through-hole and that said contact is registered with and is exposed from said contact-through-hole;
forming at least one conductive strip on said pad-mounting surface and said interposer, said conductive strip having a pad-connecting part that is electrically connected to and that extends from said bonding pad, and a trace part that extends from said pad-connecting part to connect electrically with said conductive contact;

forming an encapsulant layer on said die-mounting surface, said interposer, and said conductive strip;

forming at least one bum-through-hole in said encapsulant layer in such a manner that said bump-through-hole exposes a portion of said trace part of said conductive strip; and forming at least one solder bump which fills said bump-through-hole to connect electrically with said portion of said trace part of said conductive strip, and which protrudes outwardly from said encapsulant layer.

23. The method of claim 22, wherein said die-mounting substrate is a printed circuit board.

24. The method of claim 22, wherein said die-mounting substrate is a rigid substrate, and is made from a material that is selected from a group consisting of polyimide, glass, and ceramic.

25. The method of claim 22, wherein said conductive strip is made from conductive paste.

26. The method of claim 22, wherein said trace part of said conductive strip has a metal layer and includes a nickel sub-layer and a gold sub-layer.

27. The method of claim 22, wherein said encapsulant layer is made from a material that is selected from a group consisting of photo ink and polyimide.

28. The method of claim 22, wherein said interposer is a resinous packaging substrate.

29. A method for making a semiconductor device, comprising the steps of:
preparing a die-mounting substrate that has a die-mounting surface and that is formed with at least one conductive contact on said die-mounting surface;
preparing a semiconductor die that has a pad-mounting surface, and at least one bounding pad formed on said pad-mounting surface;
forming a dielectric interposer on said die-mounting surface and said contacts;
patterning and etching said interposer to form a pad-through-hole and at least one contact-through-hole in said interposer in such a manner that said contact is registered with and is exposed from said contact-through-hole;
mounting said die on said die-mounting surface within said pad-through-hole;
forming at least one conductive strip on said pad-mounting surface and said interposer, said conductive strip having a pad-connecting part that is electrically connected to and that extends from said bonding pad, and a trace part that extends from said pad-connecting part to connect electrically with said conductive contact;
forming an encapsulant layer on said die-mounting surface, said interposer, and said conductive strip;
forming at least one bump-through-hole in said encapsulant layer in such a manner that said bump-through-hole exposes a portion of said trace part of said conductive strip; and
forming at least one solder bump which fills said bump-through-hole to connect electrically with said portion of said trace part of said conductive strip, and which protrudes outwardly from said encapsulant layer.

30. The method of claim 29, wherein said interposer is made from a material that is selected from a group consisting of photo ink and polyimide.

31. The method of claim 29, wherein said conductive strip is made from conductive paste.

32. The method of claim 29, wherein said trace part of said conductive strip has a metal layer and includes a nickel sub-layer and a gold sub-layer.

33. The method of claim 29, wherein said die-mounting substrate is a printed circuit board.

34. The method of claim 29, wherein said die-mounting substrate is a rigid substrate, and is made from a material that is selected from a group consisting of polyimide, glass, and ceramic.

35. A method for making a semiconductor device, comprising the steps of:
preparing a die-mounting substrate that has a die-mounting surface which is intended to form a die-mounting recess;
preparing a semiconductor die that has a pad-mounting surface, and at least one bonding pad formed on said pad-mounting surface;
mounting said die in said die-mounting recess;
forming at least one conductive strip on said pad-mounting surface and said die-mounting surface, said conductive strip having a pad-connecting part that is electrically connected to and that extends from said bonding pad, and a trace part that extends from said pad-connecting part in a lateral direction relative to said die-mounting surface and that is formed on said die-mounting surface;
forming an encapsulant layer on said die-mounting surface and said conductive strip;
forming at least one bump-through-hole in said encapsulant layer in such a manner that said bump-through-hole exposes a portion of said trace part of said conductive strip; and
forming at least one solder bump which fills said bump-through-hole to connect electrically with said portion of said trace part of said conductive strip, and which protrudes outwardly from said encapsulant layer.

36. The method of claim 35, wherein said trace part of said conductive strip has a metal layer and includes a nickel sub-layer and a gold sub-layer.

37. The method of claim 35, wherein said die is a central processing unit.

38. The method of claim 35, wherein said die is a chip set.

39. A method for making a semiconductor device, comprising the steps of:
preparing a die-mounting substrate that has a die-mounting surface and that is formed with at least one conductive contact on said die-mounting surface;
forming at least one first conductive strip on said die-mounting surface, said first conductive strip being electrically connected to and extending from said contact in a lateral direction relative to said die-mounting surface;
preparing a semiconductor die that has a pad-mounting surface, and that is formed with at least one bonding pad on said pad-mounting surface;
attaching said semiconductor die to said die-mounting surface;
forming at least one second conductive strip on said pad-mounting surface, said second conductive strip being electrically connected to and extending from said bonding pad in said lateral direction to connect electrically with a first portion of said first conductive strip;
forming an encapsulant layer on said die-mounting surface, said first and second conductive strips, and said pad-mounting surface of said die;
patterning and etching said encapsulant layer to form first and second bump-through-hole in said encapsulant layer in such a manner that said first bump-through-hole exposes a second portion of said first conductive strip therefrom, and that said second bump-throughhole exposes a portion of said second conductive strip therefrom, said first and second portions of said first conductive strip being offset from each other in said lateral direction; and forming first and second solder bumps in such a manner that said first solder bump fills said first bump-through-hole to connect electrically with said second portion of said first conductive strip and protrudes outwardly from said encapsulant layer, and that said second solder bump fills said second bump-through-hole to connect electrically with said portion of said second conductive skip and protrudes outwardly from said encapsulant layer.

40. The method of claim 39, wherein said trace part of said first conductive skip has a first metal layer and includes a nickel sub-layer and a gold sub-layer.

41. The method of claim 39, wherein said trace part of said second conductive strip has a second metal layer and includes a nickel sub-layer and a gold sub-layer.

42. A method for making a semiconductor device, comprising the steps of:

preparing a die-mounting substrate that has a die-mounting surface and that is formed with at least one conductive contact on said die-mounting surface;

preparing a first semiconductor die that has a pad-mounting surface, and that is formed with at least one bonding pad on said pad-mounting surface;

attaching said first semiconductor die to said die-mounting surface;

preparing a dielectric interposer that is formed with a pad-through-hole and at least one contact-through-hole;

attaching said dielectric interposer to said die-mounting surface in such a manner that said pad-through-hole receives said first semiconductor die therein and exposes said pad-mounting surface therefrom, and that said contact-through-hole is registered with said contact and exposes said contact therefrom;

forming at least one first conductive strip on said pad-mounting surface of said first semiconductor die and said interposer, said first conductive strip having a pad-connecting part that is electrically connected to and that extends from said bonding pad of said first semiconductor die, and a trace part that extends from said pad-connecting part to connect electrically with said conductive contact;

forming a first encapsulant layer on said die-mounting surface, said interposer, said first conductive strip, and said pad-mounting surface of said first semiconductor die;

patterning and etching said first encapsulant layer to form at least one strip-through-hole in said first encapsulant layer in such a manner that said strip-through-hole exposes a portion of said trace part of said first conductive strip therefrom;

preparing a second semiconductor die that has a pad-mounting surface, and that is formed with at least one bonding pad on said pad-mounting surface of said second semiconductor die;

attaching said second semiconductor die to said first encapsulant layer;

forming at least one second conductive strip on said first encapsulant layer, said second conductive strip being electrically connected to said bonding pad of said second semiconductor die and filling said strip-through-hole to connect electrically with said portion of said trace part of said first conductive strip;

forming a second encapsulant layer on said first encapsulant layer on said first encapsulant layer, said second semiconductor die, and said second conductor strip;

patterning and etching said second encapsulant layer to form at least one bump-through-hole in said second encapsulant layer in such a manner that said bump-through-hole exposes a portion of said second conductive strip; and forming at least one solder bump which fills said bump-through-hole to connect electrically with said portion of said second conductive strip and which protrudes outwardly from said second encapsulant layer.

43. The method of claim 42, wherein said trace part of said first conductive strip has a first metal layer and includes a nickel sub-layer and a gold sub-layer.

44. The method of claim 42, wherein said trace part of said second conductive strip has a second metal layer and includes a nickel sub-layer and a gold sub-layer.

45. A method for making a semiconductor device, comprising the steps of:

preparing a die-mounting substrate that has a die-mounting surface and that is formed with at least one conductive contact on said die-mounting surface;

preparing a semiconductor semi-package that is formed by preparing a semiconductor die that has a pad-mounting surface, and that is formed with at least one bonding pad on said pad-mounting surface, forming at least one first conductive strip on said pad-mounting surface, said first conductive strip being electrically connected to and extending from said bonding pad in a lateral direction relative to said pad-mounting surface, forming a first encapsulant layer on said pad-mounting surface and said first conductive strip, and patterning and etching said first encapsulant layer to form at least one strip-through-hole in said first encapsulant layer in such a manner that said strip-through-hole exposes a portion of said first conductive strip therefrom;

attaching said semi-package to said die-mounting surface;

forming a dielectric interposer with a die-through-hole and at least one contact-through-hole on said die-mounting surface in such a manner that said die-through-hole receives said semi-package therein and exposes said semi-package therefrom, and that said contact-through-hole is registered with said contact and exposes said contact therefrom;

forming at least one second conductive strip on said interposer and said semi-package in such a manner that said second conductive strip has a first portion that fills said strip-through-hole to connect electrically with said portion of said first conductive strip, and a second portion that fills said contact-through-hole to connect electrically with said contact;

forming a second encapsulant layer on said interposer, said second conductive strip, and said semi-package;

patterning and etching said second encapsulant layer to form at least one bump-through-hole in said second encapsulant layer in such a manner that said bump-through-hole exposes a third portion of said second conductive strip therefrom; and forming at least one solder bump which fills said bump-through-hole to connect electrically with said third portion of said second conductive strip and which protrudes outwardly from said second encapsulant layer.

46. The method of claim 45, wherein said interposer is a resinous packaging substrate.

47. The method of claim 45, wherein said trace part of said first conductive strip has a first metal layer and includes a nickel sub-layer and a gold sub-layer.

48. The method of claim 45, wherein said trace part of said second conductive strip has a second metal layer and includes a nickel sub-layer and a gold sub-layer.

* * * * *